(12) United States Patent
Oakes et al.

(10) Patent No.: US 7,378,965 B2
(45) Date of Patent: *May 27, 2008

(54) MERCHANDISE MARKING WITH PROGRAMMABLE TRANSPONDERS

(75) Inventors: Jonathan Oakes, Keene, NH (US); David Benjamin, Keene, NH (US)

(73) Assignee: Markem Corporation, Keene, NH (US)

( * ) Notice: Subject to any disclaimer, the term of this patent is extended or adjusted under 35 U.S.C. 154(b) by 13 days.

This patent is subject to a terminal disclaimer.

(21) Appl. No.: 11/292,812

(22) Filed: Dec. 2, 2005

(65) Prior Publication Data

US 2006/0125640 A1 Jun. 15, 2006

Related U.S. Application Data

(63) Continuation-in-part of application No. 10/843,028, filed on May 10, 2004, now Pat. No. 7,180,419.

(51) Int. Cl.
*G08B 13/14* (2006.01)

(52) U.S. Cl. ............................ 340/572.1; 340/572.7; 340/10.51; 156/277; 156/238; 53/415

(58) Field of Classification Search ............ 340/572.1, 340/10.5, 572.4, 572.5, 572.7; 156/238, 156/277, 272; 235/385, 375; 700/115, 225; 53/415, 234

See application file for complete search history.

(56) References Cited

U.S. PATENT DOCUMENTS

| | | | | |
|---|---|---|---|---|
| 5,929,760 A | * | 7/1999 | Monahan | 340/572.7 |
| 6,028,518 A | * | 2/2000 | Rankin et al. | 340/572.1 |
| 6,529,799 B1 | * | 3/2003 | Paulk et al. | 700/227 |
| 6,593,853 B1 | | 7/2003 | Barrett et al. | |
| 6,857,714 B2 | * | 2/2005 | Hohberger et al. | 347/2 |
| 6,970,070 B2 | * | 11/2005 | Juels et al. | 340/10.1 |
| 2005/0022470 A1 | * | 2/2005 | Focke et al. | 53/415 |

OTHER PUBLICATIONS

International Search Report, PCT/US06/45900, Oct. 10, 2007.

* cited by examiner

*Primary Examiner*—Anh V. La
(74) *Attorney, Agent, or Firm*—Fish & Richardson P.C.

(57) ABSTRACT

Methods and systems for programming programmable transponders are disclosed. An apparatus for programming programmable transponders can include a label supply for supplying labels, a programing zone into which the labels are conveyed, a feed-system for transporting a label to the programming zone, a source of radiation for communicating tag-information to the transponder, and a shield mechanism. The source can be disposed to illuminate a programming zone into witch the lable is transported. The shield mechanism can substantially enclose the source of radiation and a first one of the labels in the programming zone and exclude at least a second one of the labels.

21 Claims, 6 Drawing Sheets

MERCHANDISE MARKING WITH PROGRAMMABLE TRANSPONDERS

This application is a continuation-in-part application of and claims priority to application Ser. No. 10/843,028, filed May 10, 2004 now U.S. Pat. No. 7,180,419.

FIELD OF INVENTION

This invention relates to marking products, and in particular, for marking products using programmable transponders.

BACKGROUND

Current product marking schemes provide only limited information about the identity of a particular package of merchandise. As a result, it is difficult, using only information on the package, to trace mass market products to a particular source. It is even more difficult to trace the path taken by a package of merchandise through the supply chain from a manufacturer, through a chain of distributors, to a retailer.

Programmable transponders, such as RFID tags, have sufficient storage capacity to uniquely identify a package of merchandise. Such transponders offer the potential of marking mass-produced packages of merchandise with unique identifiers. The ease with which such transponders can be interrogated has the potential to render practical the task of tracking a package of merchandise through the supply chain.

SUMMARY

In a general aspect, an apparatus for programming programmable transponders, includes a label supply for supplying labels, each of the labels having a programmable transponder. The apparatus also includes a programming zone into which the labels are conveyed, a feed-system for transporting a label to the programming zone, and a source of radiation for communicating tag-information to the transponder. The source is disposed to illuminate a programming zone into which the label is transported. The apparatus also includes a shield mechanism substantially enclosing the source of radiation and a first one of the labels in the programming zone and excluding at least a second one of the labels, the second one of the labels being adjacent to the first one of the labels.

Embodiments may include one or more of the following. The shield mechanism can be configured to allow the source of radiation to program the first one of the labels without programming the second one of the labels. The shield mechanism can include an RF adsorbent material. The shield mechanism can be configured to minimize reflections between the source of radiation and the label. The apparatus can include a testing mechanism configured to test the transponder after the transponder has been exposed to the source of radiation. The apparatus can include applicator disposed adjacent to a tagging zone into which the target is conveyed. Each of the transponders can include an RFID tag. The radiation source can be an antenna. The apparatus can also include a printer disposed adjacent to a printing zone into which the target is conveyed, the printer can be configured to print visible-information on the target, the visible-information corresponding to at least a portion of the tag-information. The printer can be configured to print visible-information on the target indicating a non-functional transponder. The shield mechanism can include a Faraday cage. The shield mechanism can be a box configured to enclose the first one of the labels.

In another general aspect, a method for programming programmable transponders includes transporting a label to a programming zone, communicating tag-information to the transponder when the transponder is in the programming zone, and subsequent to communicating the tag-information to the transponder, marking the label with visible information.

Embodiments may include one or more of the following. The method can include testing the label to determine if the communication of the tag-information to the transponder was successful. Marking the label with visible information can include marking the label with visible information based on the testing of the label. Marking the label with visible information based on the testing of the label can include marking the label with visible information that is substantially consistent with the tag information if the testing determines that the communication of the tag-information to the transponder was successful. Marking the label with visible information based on the testing of the label can include marking the label with visible information indicating a defective label if the testing determines that the communication of the tag-information to the transponder was not successful. The method can also include automatically removing a label if the testing determines that the communication of the tag-information to the transponder was not successful. The method can also include transporting the label to an applicator disposed adjacent to a tagging zone into which a target is conveyed subsequent to marking the label with visible information and affixing the label to the target when the target is in the tagging zone. Transporting the label to the programming zone can include transporting a strip of labels through the programming zone, the label being affixed to the strip. The method can also include marking the target with visible information, the visible information being consistent with the tag information

DETAILED DESCRIPTION

The present invention provides a marking apparatus for automatically applying programmable transponders onto a target. The target is typically a unit of merchandise, such as a box containing individual units to be sold at retail, retail packages themselves, or any other item that would be marked with either a label or by imprinting information directly thereon.

The programmable transponder is intended to encode information (referred to herein as "tag-information") about the target to which it is attaches. However, the programmable transponders do not come with tag-information already encoded. As a result, it is necessary to encode tag-information on the transponder and to read back that tag-information to confirm proper programming and operation of the programmable tag. These processes shall be collectively referred to as "programming" the transponder. This extra requirement of programming a transponder is not present in a conventional marking apparatus.

In one embodiment, described in connection with FIG. 1, the transponder is programmed after having been applied to the target. In other embodiments, described in connection with FIGS. 2 and 3, the transponder is programmed before it is applied to the target. In either of these embodiments, an optional printer can be included to imprint a bar code, or human-readable identifying information, that is consistent with the tag-information. Such information is collectively referred to herein as "visible" information.

Figure 4:
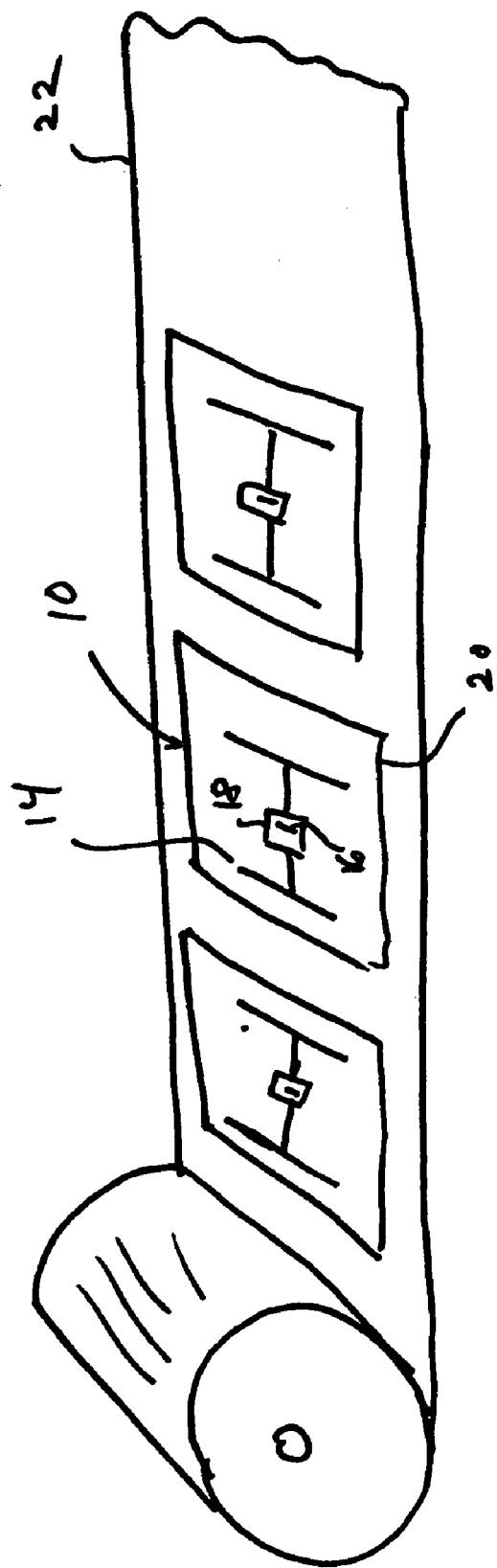
FIG. 4 shows a label having an RFID tag.

In the embodiments described herein, the programmable transponder is a radio frequency identification ("RFID") tag on a label that, together with many other labels, is affixed to a flexible strip. Referring to FIG. 4, an exemplary label 10 includes an RFID tag having a tag-antenna 14 in electrical communication with a transponder 16 integrated into a semiconductor chip 18. The label 10 has an adhesive side 20 that adheres to a flexible strip 22. This adhesive side 20 is also intended to adhere to a target.

Referring back to FIG. 1, a first embodiment of the marking apparatus 24 features a conveyor-belt 26 driven by a conveyor-motor (not shown) in a downstream direction 28. At an upstream end of the conveyor-belt 26, a feed-system 30 driven by a feed-motor (not shown) guides a strip 22 of labels 10 from a label-holder 32 to an applicator 34.

The applicator 34 includes walls defining a cavity in fluid communication with a blower-motor (not shown). One wall of the applicator 34 is a grill 36 that defines a tagging zone at a front side thereof and into which the conveyor-belt 26 conveys a target 38. The blower-motor is configured to generate a negative pressure to draw air through the grill 36 and into the cavity. Inside the cavity are a plurality of air jets (not shown) oriented to direct compressed air through the grill 36, toward the tagging zone. An applicator 34 of this type is that sold under the trade name CIMJET 331 by Markem Corporation of Keene, N.H.

The feed-system 30 peels the label 10 from the strip 22 so that the adhesive side 20 of the label 10 faces away from the grill 36, and passes the peeled label 10 to the applicator 34. A feed-system 30 adaptable for guiding a strip 22 of labels toward the applicator 34 is the CIMJET 300, which is manufactured and sold by Markem Corporation of Keene, N.H.

The conveyor-motor, the feed-motor, the blower-motor, and the air jets are all controlled by a processor 40. In operation, the processor 40 causes the conveyor-motor to drive the conveyor-belt 26. Meanwhile, the processor 40 causes the feed-motor to drive the feed-system 30 until a peeled label 10 is passed to the applicator 34. The negative pressure applied by the blower-motor then holds the label 10 against the grill 36 until such time as the conveyor-belt 26 brings a target 38 into the tagging zone.

Upon detection of a target 38 approaching the tagging zone, a first edge-detector 42, positioned upstream of the applicator 34, sends a trigger signal to the processor 40. After a brief delay, to allow the conveyor-belt 26 to center the target 38 in the tagging zone, the processor 40 causes the air jets to provide a sudden burst of positive pressure. This blows the label 10 toward the target 38 so that the adhesive side 20 of the label 10 sticks to the target 38.

Downstream from the applicator 34 is a transponder-interface 44 in data communication with the processor 40. The transponder-interface 44 is in electrical communication with an antenna 46 having a field-of-view oriented to define a programming zone into which the conveyor-belt 26 conveys the target 38. In this embodiment, the conveyor-belt 26 conveys the target 38 into the programming zone after the target 38 has already been through the tagging zone. As a result, the transponder 16 is affixed to the target 38 before being programmed.

A second edge-detector 48, also in communication with the processor 40, detects entry of a target 38 into the programming zone. Upon detecting such entry, the second edge-detector 48 provides a trigger signal to the processor 40. After a brief delay, to allow the conveyor-belt 26 to center the target 38 within the programming zone, the processor 40 causes the transponder-interface 44 to generate an encoding signal to be received by the transponder 16.

The encoding signal has the effect of encoding tag-information in the transponder 16. The tag-information can include a serial number that uniquely identifies the target 38. However, the subject matter of the invention does not depend on the particular nature of the tag-information.

Before the conveyor-belt 26 can finish conveying the target 38 through the programming zone, the processor 40 causes the transponder-interface 44 to generate an interrogation signal requesting the transponder 16 to identify itself. A transponder 16 that operates correctly will then radiate a response signal containing the tag-information encoded therein. The antenna 46 receives this response signal and provides it to the transponder-interface 44. The transponder-interface 44 then confirms that the transponder 16 is operating correctly and provides this information to the processor 40.

In some cases, either there is no response signal or the response signal contains erroneous tag-information. In this case, the processor 40 can take several courses of action. It can, for example, stop the conveyor-belt 26 and sound an alarm requesting intervention by an attendant. Or, the processor 40 can actuate an optional arm that pushes the target 38 off the conveyor-belt 26.

In some cases, depending on the nature of the target 38, the manufacturer may be willing to accept a certain number of defective transponders 16. In such cases, the processor 40 maintains statistics on the number and frequency of defective transponders 16. The processor 40 may then be configured to do nothing until either a threshold number of defective transponder is reached, or until the occurrence of defective transponders 16 becomes too frequent. If either of these events occur, the processor 40 can be configured to request intervention by an attendant, or to cause an optional arm to push targets having defective transponders 16 off the conveyor-belt 26.

Figure 1:
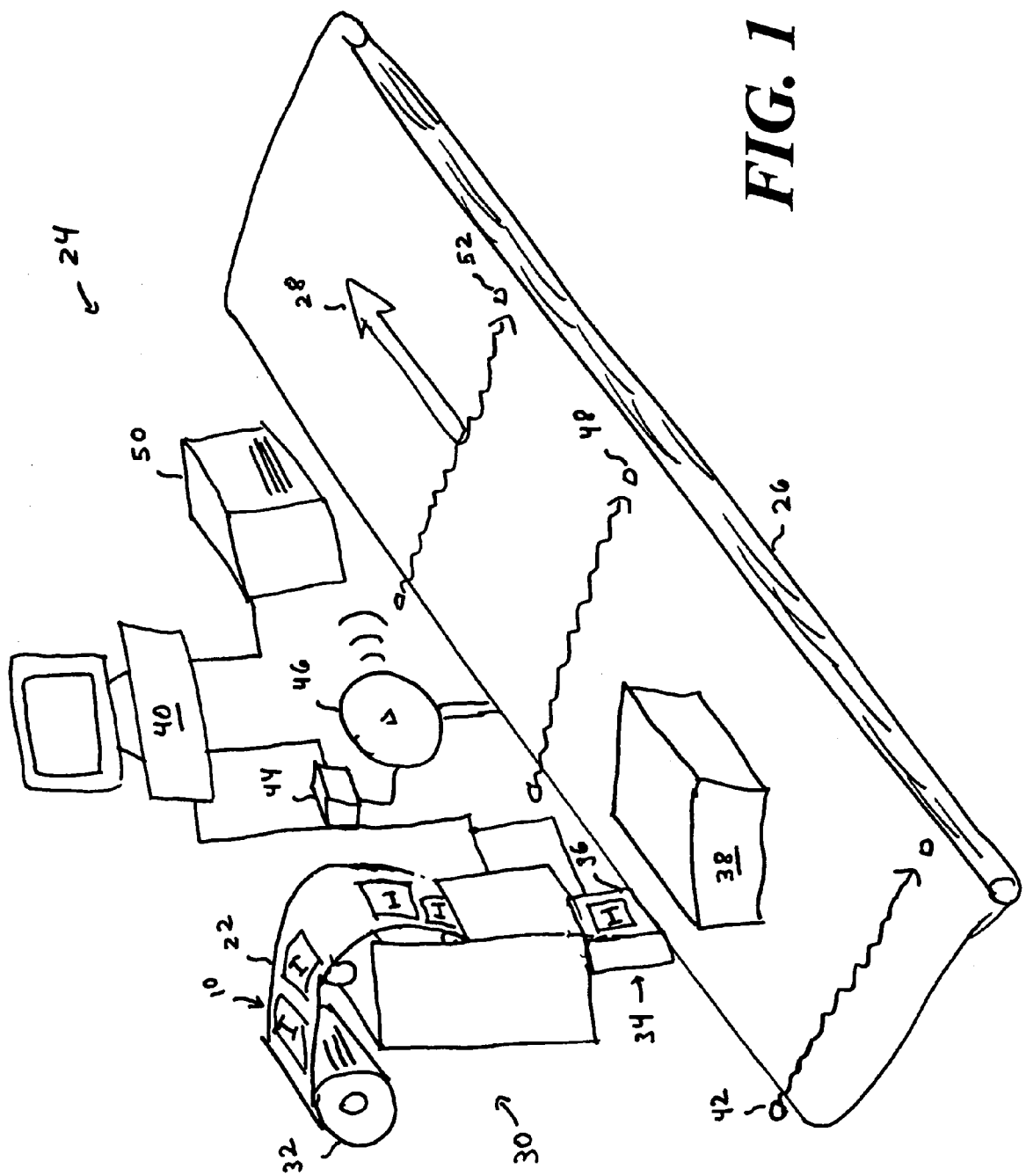
FIG. 1 shows a marking apparatus in which a transponder is programmed after it is affixed to a target.

FIG. 1 also shows an optional printer 50 controlled by the processor 40. The printer 50 has a printing zone through which the conveyor-belt 26 passes the target 38. A third edge-detector 52 sends a trigger signal to the processor 40 to indicate entry of the target 38 into the printing zone.

As shown in FIG. 1, the conveyor-belt 26 passes the target 38 through the printing zone after the target 38 has already passed through the programming zone. However, in other embodiments, the printing zone is upstream from the programming zone or even upstream from the tagging zone.

In a marking apparatus 24 having a printer 50, the processor 40 causes the printer 50 to mark the target 38 with visible-information that corresponds, at least in part, to the tag-information. The printer 50 need not mark the target 38 directly. Instead, the printer 50 can mark the target 38 by printing visible-information on a label and applying that label to the target 38 in a conventional manner. If a target 38 is labeled with a defective transponder 16, the printer 50 can mark the target 38 with visible-information indicating that the transponder 16 is defective. Examples of label applicators 34 that can be incorporated into the marking apparatus 24 include any of the CIMJET labeling machines sold by Markem Corporation, of Keene, N.H.

In some cases, it may not be desirable to apply the label 10 to the target 38 until the transponder 16 has been programmed. This will allow the operation of the transponder 16 to be verified before the label 10 containing the transponder 16 is affixed to the target 38. An additional embodiment of the marking apparatus 24, shown in FIG. 2, achieves this by having the feed-system 30 guide the strip 22 of labels through the programming zone of the antenna 46. In this embodiment, a label 10 on the strip 22 passes through the programming zone on its way from the label-holder 32 to the applicator 34.

Figure 2:
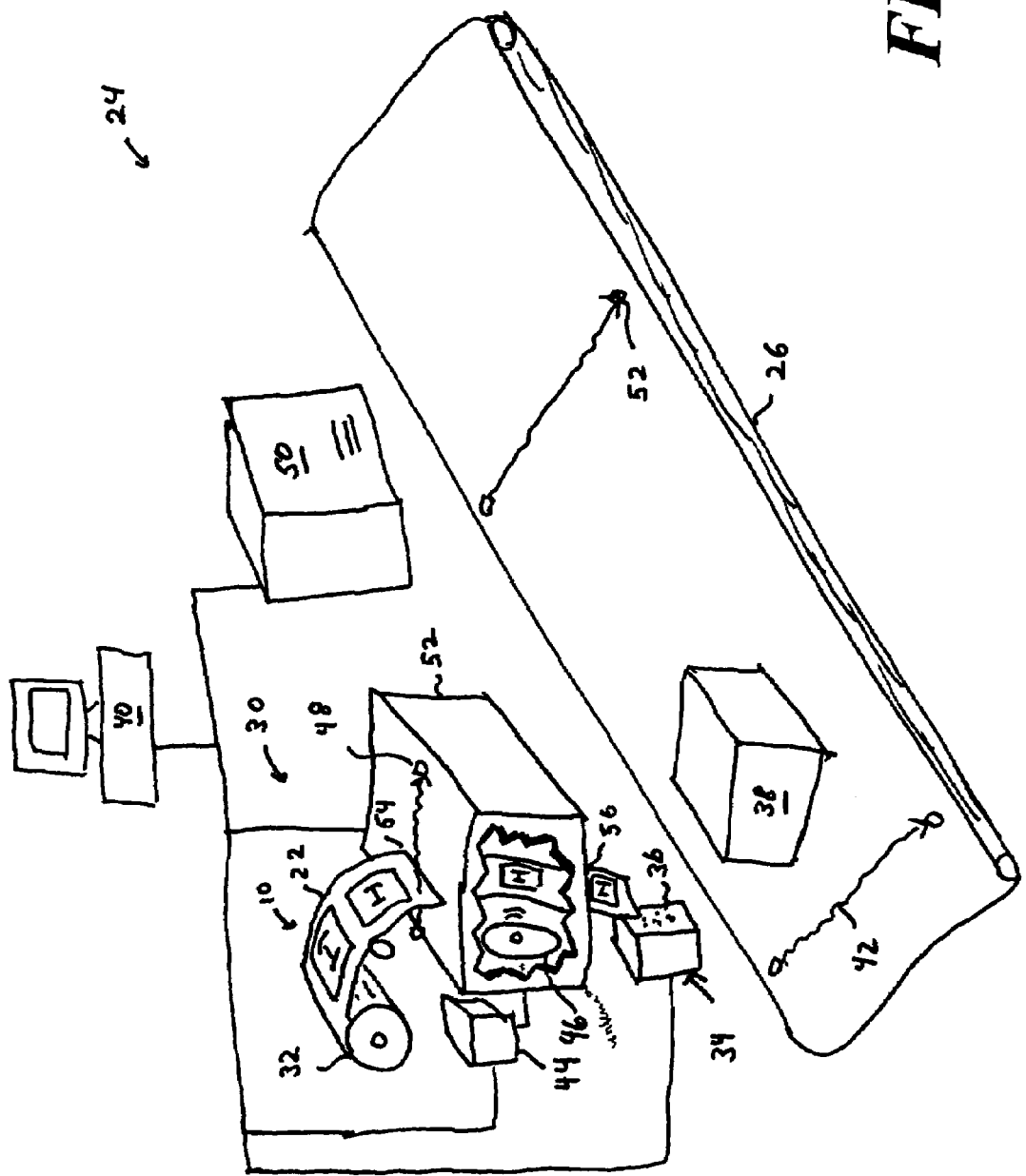
FIG. 2 shows a marking apparatus in which the transponder is programmed before it is affixed to the target.

In the embodiment of FIG. 2, a second edge-detector 48, also in communication with the processor 40, detects entry of a label 10 into the programming zone. Upon detecting such entry, the second edge-detector 48 provides a trigger signal to the processor 40. After a brief delay, to allow the transponder 16 to be centered within the programming zone, the processor 40 causes the antenna 46 to radiate an encoding signal and an interrogating signal to the transponder 16, as discussed in connection with FIG. 1.

If the transponder 16 fails to respond, or if it responds with erroneous tag-information, the processor 40 can cause the conveyor-belt 26 to move the target 38 away from the tagging zone so that when the defective label 10 reaches the grill 36, the applicator 34 can blow the defective label 10 across the conveyor-belt 26, thereby preventing it from being affixed to any target 38.

To avoid having defective labels scattered on the floor nearby, the feed system 30 can include a selective peeling bar to peel the label 10 off the strip 22. A selective peel bar suitable for incorporation into the feed system 30 is described in a co-owned and concurrently filed patent application entitled "Peel Bar for Selective Label Application," the contents of which are herein incorporated by reference.

Because the labels 10 lie close to each other on the strip 22, the programming zone may encompass more than one label 10. When this is the case, the encoding signal may affect more than one transponder 16. To avoid this, the illustrated embodiment features an antenna 46 enclosed by a Faraday cage 52 having an entrance aperture 54 and an exit aperture 56. Because the Faraday cage 52 confines electromagnetic radiation within it, the programming zone is restricted to the interior of the cage 52.

The strip 22 is threaded such that it passes through the entrance aperture 54, into the Faraday cage 52, and out the exit aperture 56. The feed-motor drives the strip 22 at a rate such that encoding and interrogation can occur while the label 10 is inside the Faraday cage 52. The distance between the entrance aperture 54 and exit aperture 56 is selected such that when a label 10 is completely inside the cage 52, its neighboring labels are outside the cage 52. This ensures that when a particular transponder 16 is programmed, the neighboring transponders remain unaffected.

As noted above, by having the same processor 40 control both the printer 50 and the transponder-interface 44, the visible-information on a target 38 can easily be made consistent with the tag-information. However, when the printing zone and the programming zone are separated from each other, the marking apparatus 24 can mistakenly label the target 38 with visible-information that is inconsistent with the tag-information. This may occur, for example, if a target 38 falls off the conveyor-belt 26, or if a target 38 that has fallen off the conveyor-belt 26 is inadvertently replaced out of sequence.

Figure 3:
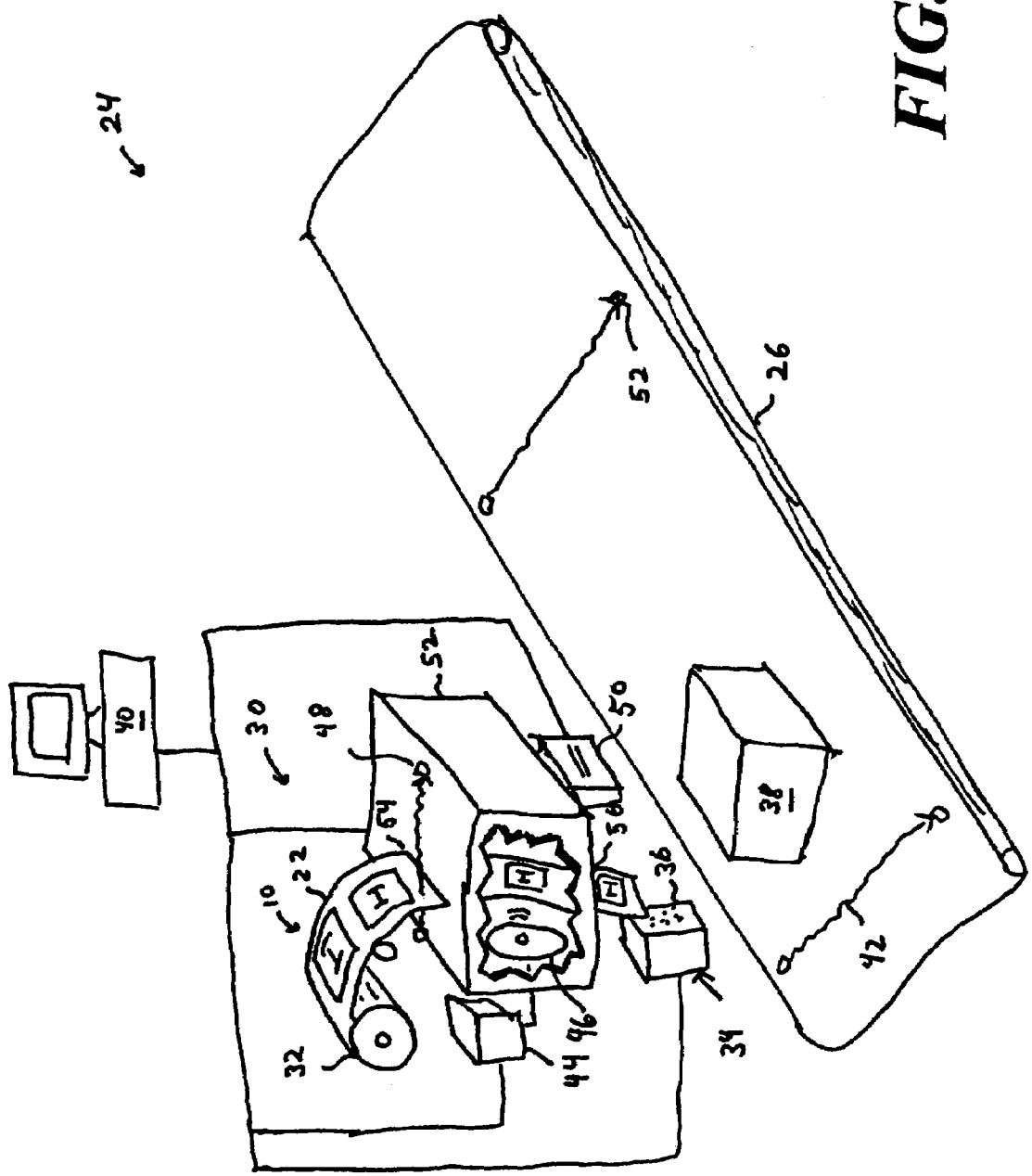
FIG. 3 shows a marking apparatus in which the printing zone overlaps the application zone.

To avoid inconsistency between the visible-information and the tag-information, another embodiment of the marking apparatus 24 features a printer 50 disposed such that the printing zone and the tagging zone at least partially overlap, as shown in FIG. 3. In this case, only the first edge-detector 42 is necessary. A marking apparatus 24 such as that shown in FIG. 3, in which application of the label 10 and the printing of visible-information occur without having to move the target 38, reduces the likelihood of an inconsistency between the tag-information and the visible-information.

While the embodiments described herein encode tag-information in an RFID tag, the invention does not depend on the particular type of transponder 16 that is attached to the label 10. In fact, the scope of the invention is circumscribed only by the appended claims.

Figure 5B:
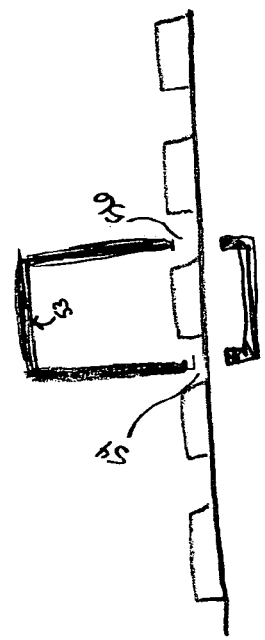
FIGS. 5A and 5B show a shield device.
Figure 5A:
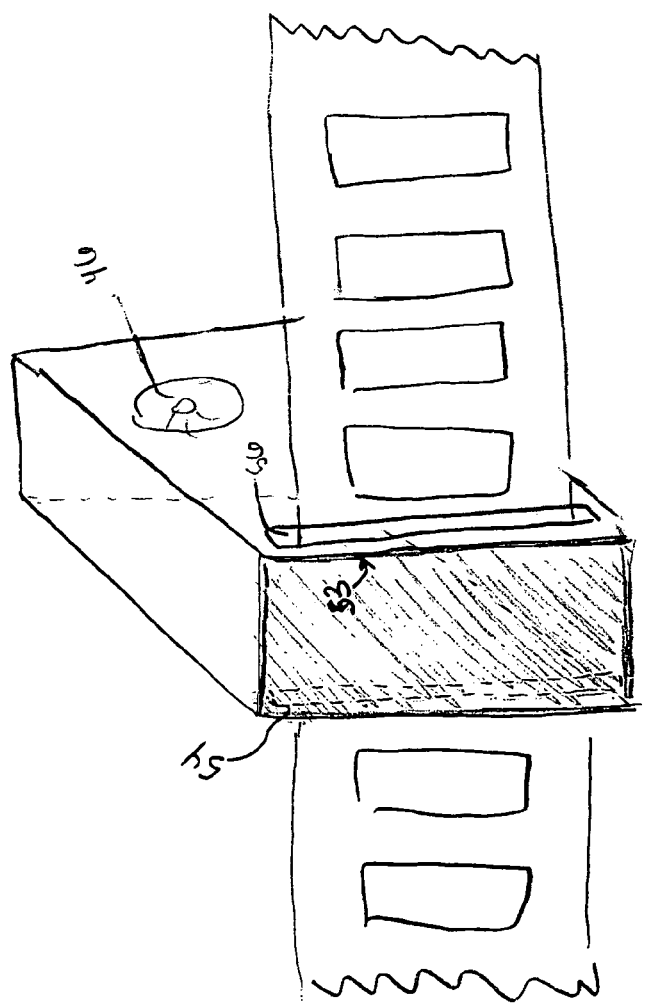

In some embodiments, as shown in FIGS. 5A and 5B, RF adsorbent materials 53 can be disposed along the walls of the cage 52. The RF use of RF adsorbent materials can minimize unwanted reflections of the encoding signal.

Figure 6:
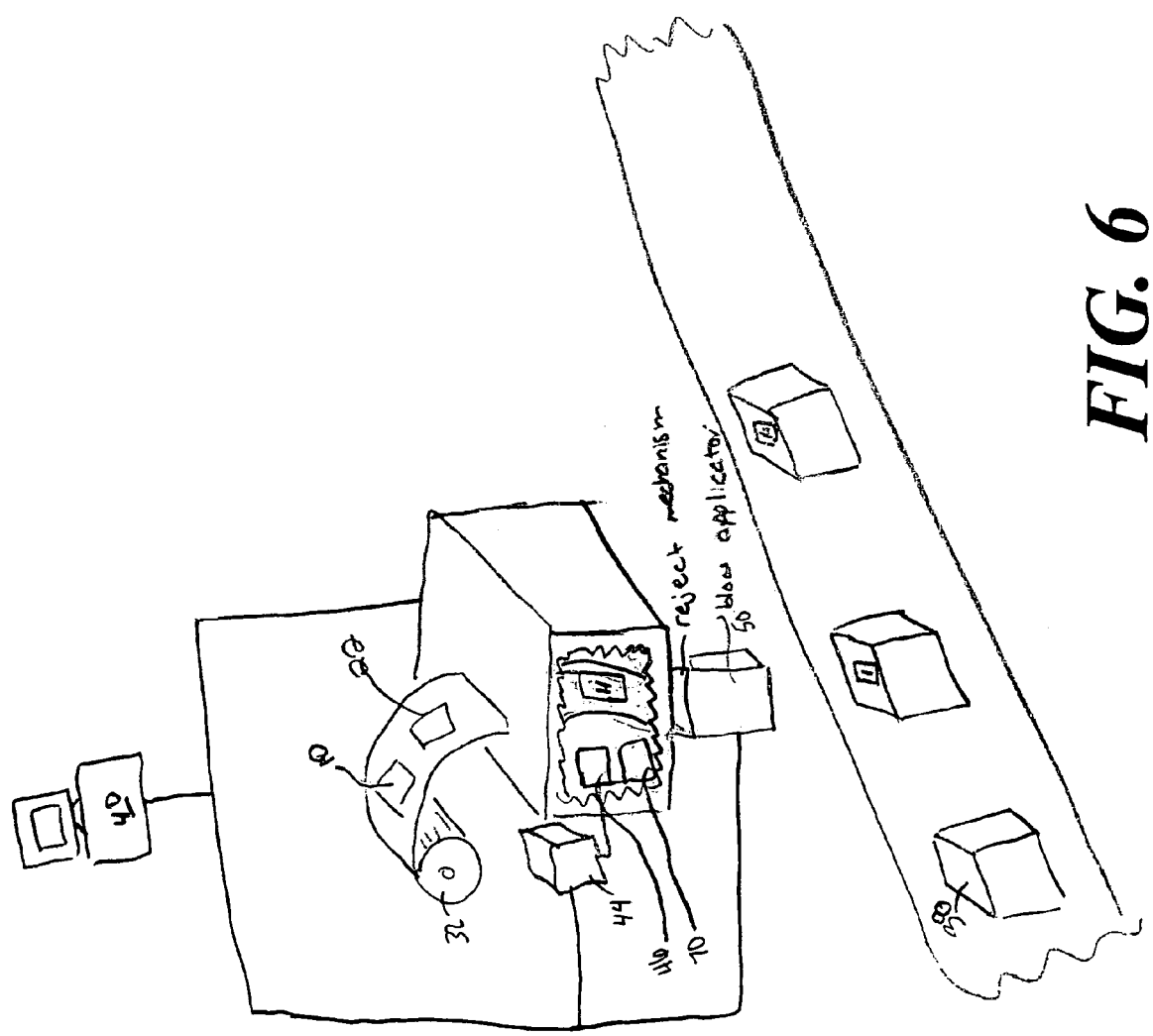
FIG. 6 shows a marking apparatus in which the transponder is programmed before visible information is printed on the tag.

In the embodiment of FIG. 6, in addition to or instead of marking the target 38 with visible information corresponding to the tag-information, the label 10 is marked with visible information. In such embodiments, the label 10 enters the programming zone and the computer 40 detects the entry of a label 10 into the programming zone. Upon detecting such entry, after a brief delay, the computer 40 causes the antenna 46 to radiate an encoding signal. Processor 40 also causes the antenna 46 to radiate interrogating signal to the transponder 16. As discussed in connection with FIG. 1, the interrogating signal reads back that tag-information to confirm proper operation of the programmable tag. This allows the operation of the transponder 16 to be verified before the label 10 containing the transponder 16 is printed and affixed to the target 38.

Subsequent to the programming of label 10, label 10 is transported to a label printing zone. The label printing zone can be disposed adjacent to the programming zone or the label printing zone can be integral with the programming zone. While in the label printing zone, the printer 70 can print various visible information onto the label 10. For example, the visible information printed on label 10 can correspond to the tag-information encoded on the tag.

In some embodiments, the printer 70 prints various messages on the labels 10 to indicate whether the tag has been successfully encoded. For example, if the transponder 16 failed to respond, or if it responded with erroneous tag-information, the printer 70 can apply a marking indicating that the label is not good. On the other hand, if the transponder 16 responded with the correct tag-information, the printer can apply a marking that includes the desired information corresponding, at least in part, to the tag-information encoded on the label 10. Thus, a single printer 70 marks both labels that have been successfully encoded and labels that have not been successfully encoded.

While in the embodiment described above the printer applied a marking to indicate that a label was not good, alternatively the printer can skip printing on the defective label and print information only on the labels which have been successfully encoded.

Having described the invention, and a preferred embodiment thereof, what is claimed as new, and secured by Letters Patent, is:

1. An apparatus for programming programmable transponders, the apparatus comprising:
   a label supply for supplying labels, each of the labels having a programmable transponder;
   a programming zone into which the labels are conveyed;
   a feed-system for transporting the label to the programming zone;
   a source of radiation for communicating tag-information to the transponder, the source being disposed to illuminate the programming zone into which the label is transported; and
   a shield mechanism substantially enclosing the source of radiation and a first one of the labels in the programming zone and excluding at least a second one of the labels, the second one of the labels being adjacent to the first one of the labels.

2. The apparatus of claim 1, wherein the shield mechanism is configured to allow the source of radiation to program the first one of the labels without programming the second one of the labels.

3. The apparatus of claim 1, wherein the shield mechanism comprises an RF adsorbent material.

4. The apparatus of claim 1, wherein the shield mechanism is configured to minimize reflections between the source of radiation and the label.

5. The apparatus of claim 1, further comprising a testing mechanism configured to test the transponder after the transponder has been exposed to the source of radiation.

6. The apparatus of claim 1, further comprising an applicator disposed adjacent to a tagging zone into which a target is conveyed.

7. The apparatus of claim 1, wherein each of the transponders comprises an RFID tag.

8. The apparatus of claim 1, wherein the radiation source comprises an antenna.

9. The apparatus of claim 1, further comprising a printer disposed adjacent to a printing zone into which a target is conveyed, the printer being configured to print visible-information on the target, the visible-information corresponding to at least a portion of the tag-information.

10. The apparatus of claim 9, wherein the printer is further configured to print visible-information on the target indicating a non-functional transponder.

11. The apparatus of claim 1, wherein the shield mechanism comprises a Faraday cage.

12. The apparatus of claim 1, wherein the shield mechanism comprises a box configured to enclose the first one of the labels.

13. A method for programming programmable transponders, the method comprising:
   transporting a label to a programming zone, the label having a programmable transponder;
   communicating tag-information to the transponder when the transponder is in the programming zone; and
   subsequent to communicating the tag-information to the transponder, marking the label with visible information consistent with the tag information.

14. The method of claim 13, further comprising testing the label to determine if the communication of the tag-information to the transponder was successful.

15. The method of claim 14, wherein marking the label with visible information includes marking the label with visible information based on the testing of the label.

16. The method of claim 15, wherein marking the label with visible information based on the testing of the label includes marking the label with visible information being substantially consistent with the tag information if the testing determines that the communication of the tag-information to the transponder was successful.

17. The method of claim 15, wherein marking the label with visible information based on the testing of the label includes marking the label with visible information indicating a defective label if the testing determines that the communication of the tag-information to the transponder was not successful.

18. The method of claim 14, further comprising automatically removing a label if the testing determines that the communication of the tag-information to the transponder was not successful.

19. The method of claim 13, further comprising:
   subsequent to marking the label with visible information, transporting the label to an applicator disposed adjacent to a tagging zone into which a target is conveyed, and
   affixing the label to the target when the target is in the tagging zone.

20. The method of claim 13, wherein transporting the label to the programming zone comprises transporting a strip of labels through the programming zone, the label being affixed to the strip.

21. The method of claim 19, further comprising marking the target with visible information, the visible information being consistent with the tag information.

* * * * *

UNITED STATES PATENT AND TRADEMARK OFFICE
CERTIFICATE OF CORRECTION

PATENT NO. : 7,378,965 B2  Page 1 of 1
APPLICATION NO. : 11/292812
DATED : May 27, 2008
INVENTOR(S) : Jonathan Oakes and David Benjamin It is certified that error appears in the above-identified patent and that said Letters Patent is hereby corrected as shown below:

|   | Issued Patent | | Description of Error |
|---|---|---|---|
|   | Column | Line |   |
| 1 | Title Page Col. 2 (Abstract) | 4 | Delete "programing" and insert -- programming -- |
| 2 | Title Page Col. 2 (Abstract) | 9 | Delete "witch" and insert -- which -- |
| 3 | Title Page Col. 2 (Abstract) | 9 | Delete "lable" and insert -- label -- |

Signed and Sealed this

Twenty-sixth Day of August, 2008

JON W. DUDAS
*Director of the United States Patent and Trademark Office*